United States Patent [19]
Kothandaraman et al.

[11] Patent Number: 5,952,866
[45] Date of Patent: Sep. 14, 1999

[54] CMOS OUTPUT BUFFER PROTECTION CIRCUIT

[75] Inventors: Makeshwar Kothandaraman; Bernard Lee Morris, both of Emmaus; Bijit Thakorbhai Patel, Breinigsville; Wayne E. Werner, Coopersburg, all of Pa.

[73] Assignee: Lucent Technologies, Inc., Murray Hill, N.J.

[21] Appl. No.: 09/069,049

[22] Filed: Apr. 28, 1998

[51] Int. Cl.⁶ .................................................... H03L 5/00
[52] U.S. Cl. .......................... 327/333; 327/318; 327/319
[58] Field of Search .................................. 327/309, 313, 327/315, 318, 319, 321, 322, 333, 327; 326/80, 81, 33, 34; 361/91

[56] References Cited

U.S. PATENT DOCUMENTS 5,751,179  5/1998  Pietruzynski et al. .................. 327/379
5,801,569  5/1998  Pinkham ................................. 327/333

*Primary Examiner*—Tuan T. Lam

[57] ABSTRACT

A low voltage CMOS output buffer protection circuit is configured to protect an associated output buffer from any high voltage signals (e.g., 5V) that may appear along a signal bus line. The protection circuit is also "hot-pluggable", meaning that the protection circuit will not draw any current when not powered (i.e., when VDD is not present). An on-chip reference voltage generator is used to provide a reference voltage VDD2 that will be essentially equal to VDD as long as VDD is present. When VDD is not present, VDD2 will track the signal appearing along the signal bus (PAD), remaining at least two diode drops below the PAD voltage.

3 Claims, 3 Drawing Sheets

CMOS OUTPUT BUFFER PROTECTION CIRCUIT

BACKGROUND OF THE INVENTION

1. Technical Field

The present invention relates to a CMOS output buffer protection circuit and, more particularly, to a CMOS output buffer protection circuit formed in low voltage CMOS technology (i.e. 3.3V) that is tolerant of high input voltages (i.e. 5V).

2. Description of the Prior Art

In many areas of CMOS circuit design there are arrangements that include sections that run between 0–5V and other sections that use a voltage supply range of only 0–3.3V. There is often a need to provide a "buffer" circuit between these sections. Thus, there is a need to supply a circuit in standard low voltage CMOS technology (e.g., 3.3V) that can tolerate a relative high voltage (i.e., 5V) on its input. Additionally, many system configurations require a circuit that is "hot pluggable", meaning that the circuit will not draw any current from a bus that is at a high voltage, even when the circuit is not powered (i.e., when VDD is not present). Further, the circuit should be designed so that it is not "harmed" when exposed to relatively high voltages. In particular, if the gate oxide of a MOS transistor is subjected to too high a voltage, it will break down, causing gate-to-drain and/or gate-to-source shorts. Likewise, the drain-to-source junction of a MOS transistor will be degraded by hot carriers if it is subjected to too great a voltage. Thus, a MOS circuit that is subjected to voltages higher than the technology is designed to work at must be designed in such a way that the individual transistors in the circuit never see these higher voltages across their gate oxides or their source-to-drain junctions.

One problem with a low voltage technology CMOS buffer interfacing with a relatively high voltage is that the source of a P-channel output transistor is usually connected to the low voltage power supply VDD. If a voltage greater than VDD is applied to the drain of this device (where the drain is usually connected to the PAD of the buffer), it will forward bias the parasitic diode inherent in the P-channel device, since the N-tub backgate of the P-channel transistors is usually connected to VDD.

The prior art circuit of FIG. 1 solves this problem by generating a supply voltage VFLT that is equal to VDD when the PAD voltage is less than VDD, and that is equal to the PAD voltage when PAD is greater than VDD. This reference voltage VFLT is then applied to the N-tub backgate of all P-channel transistors whose source or drain is connected to PAD voltage. The use of VFLT prevents the parasitic diodes of these transistors from ever being forward biased. Referring to FIG. 1, voltage generator circuit 10 is configured to generate a supply voltage VFLT that may be applied to the N-tub backgate of a pair of P-channel transistors 10 and 12. As configured, circuit 10 is used for situations where the PAD voltage (signal bus) appearing at node A may be (at times) greater than the supply voltage VDD. In particular, when PAD goes higher than VDD by a single P-channel threshold voltage, denoted Vtp, transistor 12 turns "on" and transistor 10 turns "off". The output voltage, VFLT, is then equal to the PAD voltage. Therefore, the backgate voltage will be brought up to the high level of PAD and prevent the turn "on" of its associated parasitic diode. During normal operating conditions when PAD<VDD, transistor 10 will be "on" and transistor 12 will be "off", allowing output voltage VFLT to be equal to VDD.

While this design affords some protection for high voltages appearing at the PAD terminal, it is not "hot pluggable". That is, if VDD is not present, circuit 10 as depicted in FIG. 1 will have the full PAD voltage across the gate oxide of transistor 10. If this PAD is a relatively high voltage, then the reliability of the circuit is at risk.

One known solution to the above criteria is to utilize a relatively thick gate oxide for any devices that may be exposed to the relatively high voltages at their gate terminals and utilize a standard gate oxide for all remaining devices. This is a very expensive technique that adds appreciable extra cost and process time to conventional CMOS processing technology.

SUMMARY OF THE INVENTION

The present invention relates to a CMOS output buffer protection circuit and, more particularly, to a CMOS output buffer protection circuit formed in low voltage CMOS technology (i.e. 3.3V) that is tolerant to high input voltages (i.e. 5V) and will not draw any current in the "no power" state (i.e., when VDD is not present).

In accordance with the present invention, a reference voltage generator is used to provide a reference voltage input, denoted VDD2, to a CMOS output buffer protection circuit, where both the power supply VDD and signal bus voltage (hereinafter referred to as "PAD") are also present as inputs. The reference voltage generator provides an output VDD2 that is equal to VDD as long as VDD is present, and when VDD is not present (meaning either that VDD=0, or any other condition where the VDD voltage does not register, such as a broken lead or disconnection—all of these situations hereinafter referred to as a "hot pluggable" condition), VDD2 is held at a predetermined voltage below the PAD voltage (a typical example is holding VDD2 to a value of two diode drops below PAD). The output buffer of the present invention includes an inverter controlled by reference voltage VDD to supply a voltage denoted "PGATE" as the inverted value of VDD. The output buffer protection circuit further comprises an arrangement of N-channel and P-channel MOS devices that is capable of preventing a high voltage signal appearing at the PAD signal bus (for example, 5V) from propagating back into the logic gates forming the output buffer. When VDD is not present, the PGATE generated voltage is applied as the gate voltage to a selected P-channel device, will prevent the voltage at any node from rising above a level of VDD2-Vtn (Vtn being defined as the threshold voltage for an N-channel device), regardless of the voltage appearing at PAD.

BRIEF DESCRIPTION OF THE DRAWINGS

Referring now to the drawings, where like numerals represent like parts in several views.

DETAILED DESCRIPTION

Figure 2:
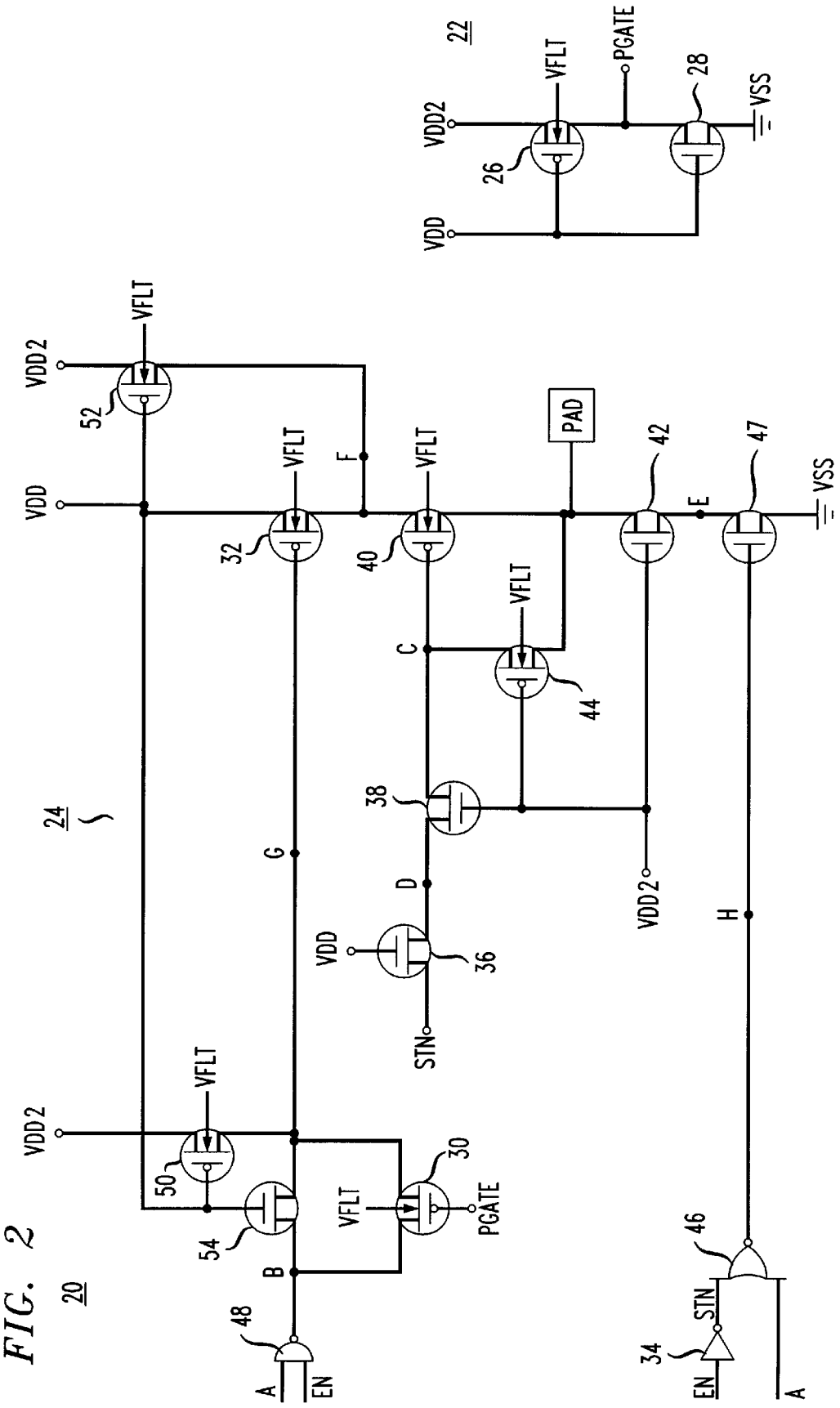
FIG. 2 illustrates an exemplary output buffer protection circuit formed in accordance with the present invention.

An exemplary CMOS output buffer protection circuit 20 is illustrated in FIG. 2. As discussed above, the circuit arrangement of the present invention is "hot pluggable", meaning that the protection circuit will not draw any current from a bus (such as PAD) that is at a high voltage, even when the circuit is not powered (i.e., when VDD is not present). In general, the circuit is configured to provide for "normal" operation when VDD is "on" (e.g., 3.0–3.6V, 3.3V nominal) and the PAD voltage is less than VDD, and to provide for "protection" operation when either VDD is "off", or the PAD voltage exceeds the VDD value.

Figure 4:
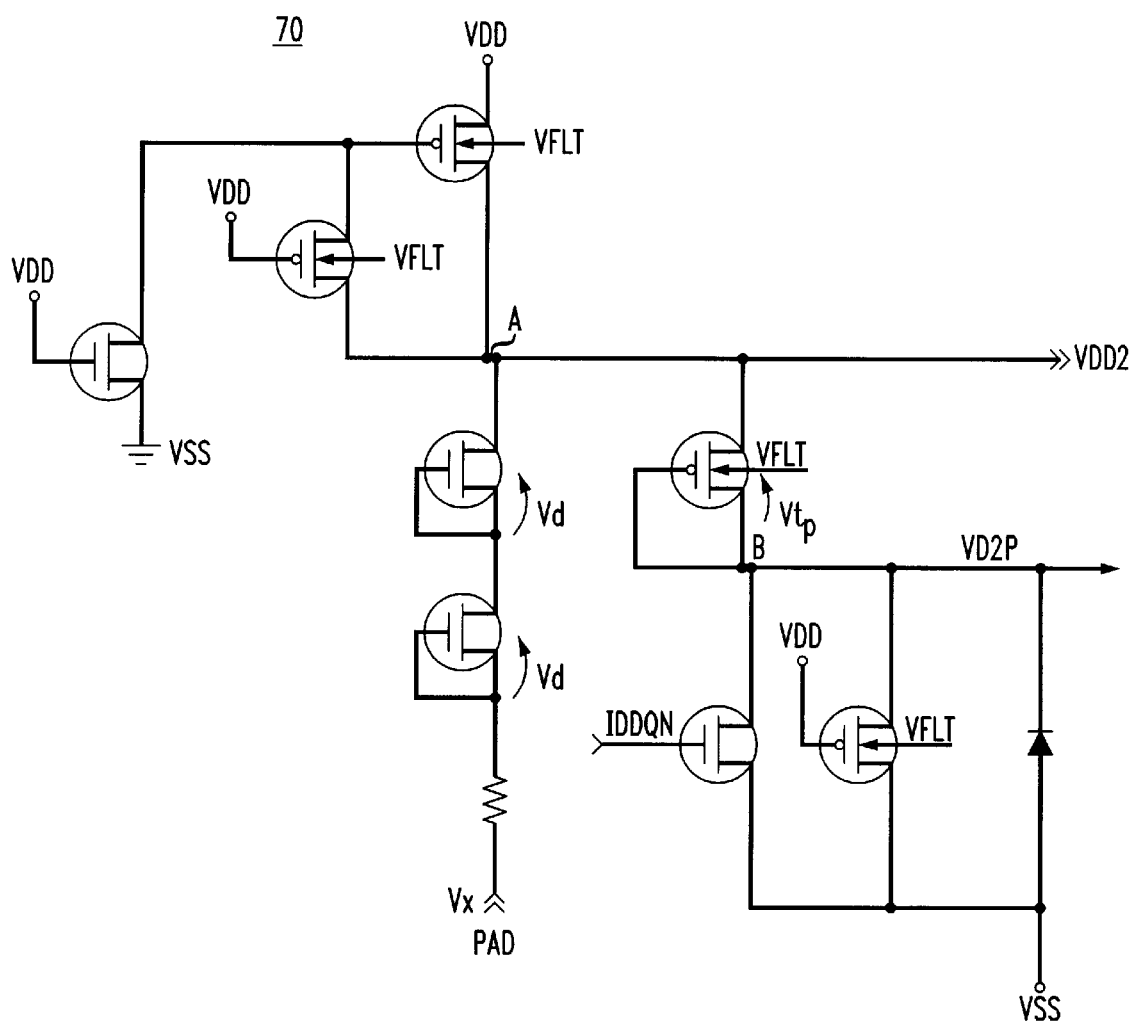
FIG. 4 contains a schematic diagram of an exemplary CMOS reference voltage generator useful with the output buffer protection circuit of the present invention.

Output buffer protection circuit 20 utilizes a generated reference voltage VDD2 to ensure the proper operation of the circuit. An exemplary CMOS reference voltage generator 70 useful in providing VDD2 from a VDD reference voltage is illustrated in FIG. 4. The CMOS reference generator is configured such that a generated reference voltage VDD2 is essentially equal to the power supply VDD as long as VDD is "present" (typically 3.0–3.6 volts, but in general any voltage above approximately 1V), regardless of the voltage on the signal bus ("PAD"), which may rise to, for example, 5V if a mix of CMOS technology is present in the circuit. If VDD is not present—meaning either that VDD=0, or any other condition where the VDD voltage does not register, such as a broken lead or disconnection (all of these situations hereinafter referred to as a "hot pluggable" condition), the circuit is configured to maintain VDD2 at a level of at least two diode drops below the voltage appearing at PAD. Therefore, even in the situation where PAD=5.5V, VDD2 will be approximately 2.8V and will therefore protect any and all following circuit elements from the PAD high voltage. In general, as long as VDD is "on", VDD2=VDD. When VDD is not present, VDD2 will be held at a predetermined voltage less than the voltage appearing at the PAD input. In a preferred embodiment, as mentioned above, VDD2 will be held approximately two diode drops below the PAD voltage.

Referring to FIG. 2, output buffer protection circuit 20 includes an inverter circuit 22 and a protection circuit 24. Inverter circuit 22 includes a P-channel device 26 and an N-channel device 28 disposed in series between the generated reference voltage VDD2 and "ground" (VSS). The gates are coupled together and held at reference potential VDD. The interconnection of the source of device 26 and the drain of device 28 forms the output from inverter 22, denoted as PGATE in FIG. 2. In operation, PGATE will remain opposite the value of VDD. Therefore, when VDD is present, PGATE will have a "low" (0) value. When VDD is not present ("hot-pluggable"), PGATE will be a "high" value. As will be described herein below, PGATE is used as a gate input to block high voltage signals from propagating back into an associated output buffer when VDD is not present.

During normal operation, as mentioned above, VDD is present and has a nominal value of 3.3V. Therefore, since VDD2=VDD, VDD2 will also be at a value of approximately 3.3V. Also, as just mentioned, PGATE will be "low". PGATE is applied as the gate input to a P-channel device 30 and will therefore turn "on" device 30. As long as device 30 is conducting, node G will track node B "rail to rail", that is, for the full range of value associated with logic signals A and EN. When node B is high, therefore, node G will also be high and will turn "off" P-channel device 32. In normal operating conditions, in a first state, the "enable input" EN will be "high". Applying signal EN to an inverter 34 will generate a "low" output signal STN, where STN is thereafter applied as the source voltage to N-channel device 36, the gate of N-channel device 36 being held at VDD. A second N-channel device 38 is connected in series with device 36, where the gate of device 38 is held at VDD2. Under normal conditions, therefore, both devices 36 and 38 will be "on" (that is, as long as reference voltages VDD and VDD2 are present). The "low" value for STN will therefore pass through both devices 36 and 38 and thereafter be applied as the gate voltage to a P-channel device 40, turning in "on". The source of device 40 is coupled to the drain of device 32 and the drain of device 40 is coupled to the "PAD" terminal. Another N-channel device, denoted device 42, is coupled at its drain to the PAD terminal and has its gate voltage held at VDD2. Therefore, as long as VDD is present, device 42 will be "on". An N-channel device 47, whose drain is connected to the source of device 42 and whose source is connected to VSS, has its gate driven by NOR gate 46. When the input A is low, nodes B, G and H will all be high, turning "on" device 47 and turning "off" device 32. Thus PAD will go low. When the input A is high, nodes B, G and H will all be low, turning "off" device 47 and turning "on" device 32, causing PAD to go high. In this first "normal" operating state, P-channel devices 44, 50 and 52 will all be "off", since their gates are connected to VDD.

A second "normal" operating state will find EN=0 (therefore, STN will be "high"). In this circumstance, protection circuit 20 will prevent any relatively high voltage appearing at PAD from passing back into the output logic circuit. In particular, as soon as the voltage appearing at PAD is at least one P-channel threshold voltage above VDD2, transistor 44 will turn "on", setting the voltage appearing at node C to PAD. This high voltage will then turn "off" device 40. Node D will be held to a value of VDD2-Vtn by device 38. Therefore, any high voltage appearing a PAD is prevented from propagating back into logic device 36. Since the gate of device 42 is held at VDD2, the voltage appearing at node E cannot rise above VDD2-Vtn, even when the PAD voltage is 5V or greater.

When VDD is not present ("hot pluggable" condition), the arrangement of protection circuit 20 is configured to not draw any current from any voltage source applied to PAD, and is also capable of preventing any high voltage appearing at PAD from propagating back into the output buffer. In particular, when VDD is not present and a high voltage is present at PAD, PGATE will go high (by operating of inverter 22) and turn "off" device 30. If a high voltage appears at PAD, reference voltage VDD2 will be held (as discussed above and illustrated in the CMOS reference generator of FIG. 4) at a predetermined voltage less than PAD, in an exemplary embodiment, at a value of two diode drops below PAD. With these values for PAD and VDD2, device 44 will be "on" and the voltage appearing at node C will be essentially equal to PAD. N-channel device 38 acts as a source-follower, allowing node D to rise no higher than VDD2-Vtn, where Vtn is the threshold voltage of an N-channel device, while the absence of reference voltage VDD will turn "off" N-channel device 36. Therefore, any high voltage appearing at node D will be prevented from propagating back into inverter 34. A pair of P-channel devices 50 and 52 have their gates biased at VDD and will therefore turn "on" during a hot pluggable event, holding nodes G and F, respectively, at VDD2, ensuring that transistors 32 and 40 will not have a voltage in excess of 3.6 volts across their gate oxides. An N-channel device 54 is coupled to P-channel device 30 so as to form a transmission gate, where the gate of device 54 is held at VDD. When VDD is not present, device 54 will be held "off". Since device 30 is "off" as long as PGATE is high, the transmission gate will be "off". Therefore, the voltage appearing at node G will be prevented from transferring back through the transmission gate to node B and damaging the NAND gate 48.

Figure 1:
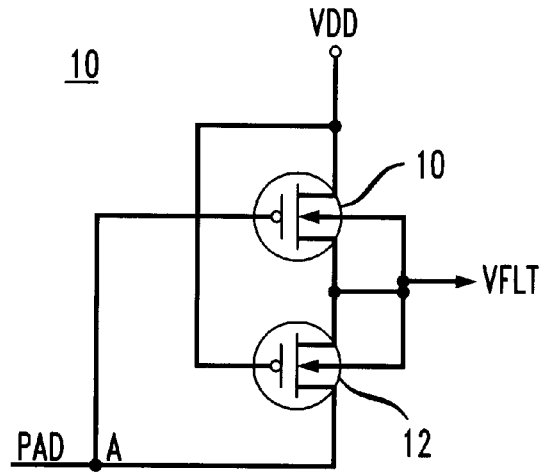
FIG. 1 illustrates a prior art voltage generator circuit as discussed above.
Figure 3:
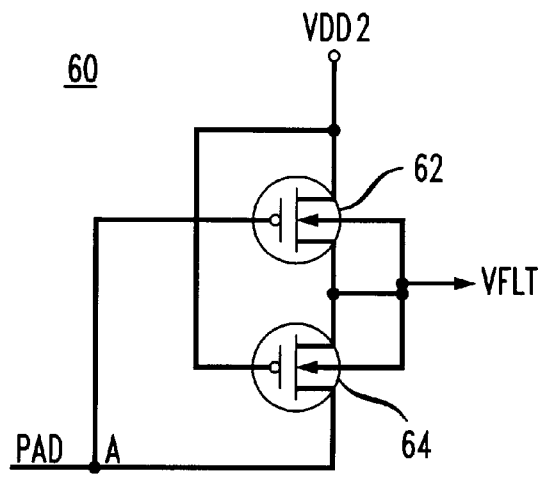
FIG. 3 illustrates an exemplary reference voltage generator used to provide the VDD2 reference voltage for the output buffer protection circuit of FIG. 2.

In accordance with the present invention, a protection voltage VFLT may be generated and applied as an N-tub backgate protection voltage to all of the P-channel devices. FIG. 3 illustrates an exemplary arrangement for providing VFLT. The circuit of FIG. 3 is essentially identical to the prior art circuit of FIG. 1, except that the source of transistor 62 is coupled to the generated voltage VDD2 instead of supply voltage VDD. The use of VDD2 thus insures that VFLT will be present under all circumstances and prevent the intrinsic diodes present in the P-channel devices from being activated.

As seen from the above discussion, none of the devices in circuit 20 have a gate or source-to-drain voltage greater than the normal VDD (3.6 V maximum value) in the case where either VDD is not present or VDD is "on". Therefore, the output buffer protection circuit of the present invention allows a standard digital CMOS input buffer made in a low voltage technology to interface with high voltage signals (PAD) in both normal (VDD "on") and "hot-plug" (VDD "off") conditions.

What is claimed is:

1. An integrated circuit including an CMOS output buffer protection circuit comprising a CMOS inverter circuit, coupled to a generated potential VDD2, responsive at its input to a known reference voltage VDD for providing an output voltage PGATE that is the inverse value of VDD; and a protection circuit including a transmission gate comprising a first P-channel device and a first N-channel device, the gate of the first P-channel device held at the output voltage PGATE and the gate of the first N-channel device held at the known reference voltage VDD, the sources of the first P-channel device and the first N-channel device coupled together to form the transmission gate input and responsive to a logic signal output from a first output buffer circuit (node B), and the drains of the first P-channel device and the first N-channel device coupled together to form the transmission gate output (node G), wherein when VDD is not present, the first P-channel device and the first N-channel device will turn "off" and block any voltages greater than VDD-Vtn, where Vtn is the threshold voltage of the first N-channel device, from propagating back into the first output buffer circuit;

a second P-channel device having its gate coupled to the transmission gate output and biased at its source to VDD;

a series connection of a second N-channel device and a third N-channel device, the drain of the second N-channel device coupled to receive a logic signal input from a second output buffer circuit, the gate of said second N-channel device held at VDD and the source of said second N-channel device coupled to the drain of the third N-channel device, where the gate of the third N-channel device is held at the generated potential VDD2;

a third P-channel device coupled at its source to the drain of the second P-channel device and coupled at its drain to a bus reference voltage (PAD), where the gate of the third P-channel device is coupled to the source of the third N-channel device;

a fourth P-channel device coupled at its drain to the generated potential VDD2 and having its gate held at the reference voltage VDD, the source of the fourth P-channel device coupled to the output of the transmission gate;

a fifth P-channel device coupled at its drain to generated potential VDD2 and having its gate held at the reference voltage VDD, the source of the fifth P-channel device coupled to the drain of the second P-channel device; and a sixth P-channel device having its gate biased at VDD2 and coupled at its source to the source of the third N-channel device, the drain of the sixth P-channel device coupled to the bus reference voltage PAD, wherein when the bus reference voltage PAD becomes greater than VDD2, the sixth P-channel device will turn "on", which turns "off" the third P-channel device.

2. An integrated circuit including an CMOS output buffer circuit as defined in claim 1 wherein the CMOS inverter circuit comprises a first P-channel device and a first N-channel device, the gates of said first P-channel device and the first N-channel device coupled together to form the inverter input and held at the known reference potential VDD, the drain of the first P-channel device held at the generated reference voltage VDD2, the source of the first N-channel device held at ground potential, where the source of the first P-channel device is coupled to the drain of the first N-channel device to form the inverter output, denoted PGATE, wherein PGATE is the inverse of VDD.

3. An integrated circuit including an CMOS output buffer as defined in claim 1 wherein further comprises a backgate protection circuit for providing a bias voltage VFLT to the N-tub backgate of the P-channel devices, wherein VFLT=VDD2.

* * * * *